United States Patent [19]

Hoshino

[11] Patent Number: 4,672,849
[45] Date of Patent: Jun. 16, 1987

[54] SEMICONDUCTOR VIBRATION DETECTING STRUCTURE

[75] Inventor: Shigeo Hoshino, Yokosuka, Japan

[73] Assignee: Nissan Motor Co., Ltd., Yokohama, Japan

[21] Appl. No.: 849,862

[22] Filed: Apr. 9, 1986

[30] Foreign Application Priority Data

Apr. 10, 1985 [JP] Japan .................................. 60-74447

[51] Int. Cl.[4] ............................................ G01N 29/04
[52] U.S. Cl. ...................................... 73/579; 73/658; 73/DIG. 1; 361/283
[58] Field of Search ................... 73/658, 579, DIG. 1; 361/280, 283

[56] References Cited

U.S. PATENT DOCUMENTS 4,507,705  3/1985  Hoshino et al. ..................... 361/283
4,571,661  2/1986  Hoshino ............................. 361/283

FOREIGN PATENT DOCUMENTS 59-38621  3/1984  Japan .
60-55655  3/1985  Japan .

*Primary Examiner*—Howard A. Birmiel
*Attorney, Agent, or Firm*—Schwartz, Jeffery, Schwaab, Mack, Blumenthal & Evans

[57] ABSTRACT

A semiconductor vibration detecting structure formed on a semiconductor substrate and a method of manufacturing the same in which the curvature of the cantilever of the vibration detecting structure in the direction gradually deviating from the surface of the semiconductor substrate can be determined by the thickness of the upper nitride layer for regulating the curvature of the cantilever, with the thicknesses of the other layers constituting the cantilever and the length thereof being constant. In the semiconductor vibration detecting structure according to the present invention, even if vibrations having relatively large vibration levels are applied to the detecting structure, the cantilever of the vibration detecting structure vibrates well but never hits the surface of the semiconductor substrate, thus enabling a wide rage of mechanical vibrations to be detected with a high sensitivity.

14 Claims, 4 Drawing Figures

SEMICONDUCTOR VIBRATION DETECTING STRUCTURE

BACKGROUND OF THE INVENTION (1) Field of the Invention

The present invention relates to a semiconductor vibration detecting structure formed on a semiconductor substrate in an extremely small size more particularly a semiconductor vibration detecting structure capable of detecting mechanical vibrations over a wide range of vibration levels with a high sensitivity and a facilitated method of manufacturing the vibration detecting structure.

(2) Description of the Prior Art

Various approaches for detecting mechanical vibrations have heretofore been proposed. Among vibration detecting structures, a mechanical vibration detecting structure utilizing IC semiconductor circuits have various advantages such as, which can be made in an extremely small size with a high sensitivity, and which can be assembled on a semiconductor substrate for a print circuit together with other integrated circuits.

In such a semiconductor vibration detecting structure as described above, a cantilever is formed on a semiconductor substrate utilizing a thin film technique such as an etching technique and the capacitance change in a capacitor formed between the cantilever and the semiconductor substrate can be electrically picked-up, so as to detect vibrations when the cantilever is vibrated due to any mechanical vibrations from outside. In the vibration detecting structure of this type, a vibration having vibration frequency equal to the resonance frequency of the cantilever which is determined in accordance with the length of the cantilever, can be detected with a high sensitivity.

One example of the semiconductor vibration detecting structure is disclosed in Japanese Patent Disclosure No. 59-38621 which is laid-open in 1984 or Japanese Patent Disclosure No. 60-55655 which is laid-opened 1985. In the semiconductor vibration detecting structures according to the prior art, it comprises, a N type silicon substrate, a P+ type diffusion layer formed on the substrate, an oxide film disposed on the P+ type diffusion layer, and a cantilever made of, for instance, boron-doped polysilicon layer faced in parallel with a predetermined distance on the oxide film, one end of the cantilever being fixed to the oxide film.

With this construction, a variable capacitor is formed between a movable portion of the cantilever and the P+ type diffusion layers. Accordingly, when mechanical vibrations are applied to the semiconductor vibration detecting structure from outside, the cantilever begins oscillating by the vibrations thus applied and the capacitance of the variable capacitor formed between the cantilever and the $P^{30}$ type diffusion layer described above also changes due to the change in the distance therebetween. As a result, vibrations of the cantilever can be detected by electrically detecting the change in the capacitance. In this case, when the vibration having a frequency equal to the resonance frequency of the cantilever, determined by the length thereof is applied thereto, the cantilever is vibrated most and a large change in the capacitance can be detected, with the result that the vibration component substantially equal to the resonance frequency can be detected with a high sensitivity.

In order to detect various vibrations up to a vibration having a small vibration level by improving the sensitivity of the semiconductor vibration detecting structure having the cantilever, the capacitance of a variable capacitor portion to be formed by the cantilever may be made large with respect to an equal vibration level described above. To this end, it will be effective to increase the resonance quality factor Q of the cantilever by placing the semiconductor vibration detecting structure in a vacuum condition.

Now, when the cantilever is resonated with a vibration from outside, and the vibration level of the cantilever becomes large, the movable portion or free end portion of the cantilever which is provided in parallel to the oxide film of the semiconductor substrate, tends to be vibrated largely by the vibration from the outside. As a result, the free end portion of the cantilever will hit the surface of the oxide film and the vibrations can often no longer be detected. For this reason, it is not possible for the semiconductor vibration detecting structure of the type to detect a wide range of vibrations including large vibration levels. In this case, when the distance between the cantilever and the oxide film is increased, the hitting of the free end portion of the cantilever against the oxide film may be avoided, even if the cantilever vibrates largely. On the other hand, however, when the distance is increased too much, it will be difficult to detect vibrations having small vibration levels.

SUMMARY OF THE INVENTION

It is an object of the present invention, therefore, to provide a semiconductor vibration detecting structure in which a wide range of mechanical vibrations having different vibration frequencies can be detected with a high sensitivity.

It is another object of the present invention to provide a semiconductor vibration detecting structure in which the cantilever is so constructed that even if relatively large vibration levels are applied to the cantilever, it vibrates well but never hits the surface of a semiconductor substrate coated with oxide film layers.

It is yet another object of the present invention to provide a semiconductor vibration detecting structure in which the cantilever consisting of a semiconductor layer such as polysilicon layer coated with nitride film layers can be formed with small dispersions and suitable for a mass production.

It is still another object of the present invention to provide a semiconductor vibration detecting structure in which the curvature of the cantilever gradually deviating from the surface of a semiconductor substrate can be determined by suitable selection of materials and the thicknesses among the layers constituting the cantilever of the semiconductor vibration detecting structure.

It is yet still another object of the present invention to provide a semiconductor vibration detecting structure in which the curvature of the cantilever gradually deviating from the surface of the semiconductor substrate can be determined by the thickness of the upper nitride film layer for regulating the curvature of the cantilever, with the thickness of the other layers and the length of the cantilever being constant.

It is yet still another object of the present invention to provide a semiconductor vibration detecting structure in which the vibration detecting structure including the cantilever portion can be integrally formed at low cost.

These and other objects, features and advantages of the invention will be better understood from the follow-

DESCRIPTION OF THE PREFERED EMBODIMENTS

Figure 1:
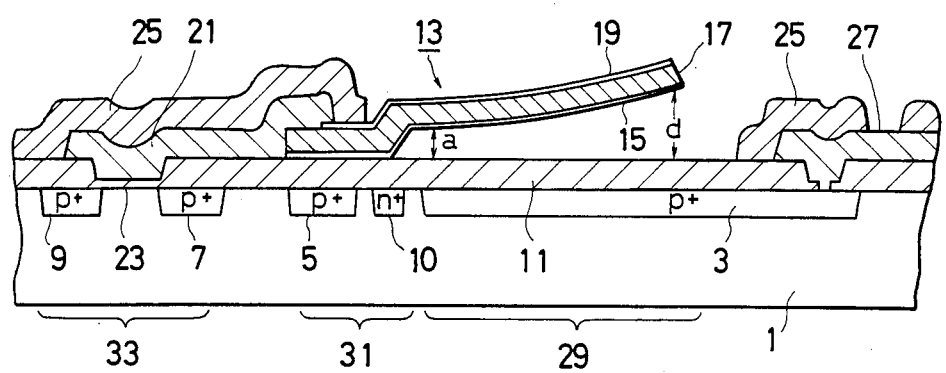
FIG. 1 is a cross-sectional view of the semiconductor vibration detecting structure according to one embodiment of the present invention.

Refering to FIG. 1, the semiconductor vibration detecting structure according to the present invention is constructed on a N type semiconductor substrate 1 made of silicon. A plurality of P+ type semiconductor diffused layers 3, 5, 7 and 9 are formed on the silicon substrate 1 and a single n+ type semiconductor diffused layer 10 formed between the p+ type layers 3, 5. An oxide film 11 is formed on the surface of the semiconductor layer consisting of the p+, n+ diffused layers and the N type substrate.

On the p+ type and n+ type diffused layers 5 and 10, there is provided a cantilever 13 above the oxide film 11. One end of the cantilever 13 is fixed on the oxide film 11 on the diffused layers 5 end 10, with the other end thereof being formed as a free and portion or movable portion. The cantilever 13 is curved and the distance between the upper surface of the oxide film 11 and the bottom surface of the cantilever 13 increases towards the extreme end of the free end portion, in such a manner that the distance therebetween at the root of the cantilever is a while the distance therebetween at its extreme free end is d.

The cantilever 13 is comprised of a boron-doped polysilicon layer 17, a lower nitride film 15 formed on the bottom surface of the silicon layer 17 and an upper nitride film 19 for regulating the degree of the curvature of the cantilever 13 on the upper surface thereof in such a manner that the two nitride films sandwich the polysilicon layer 17.

The semiconductor vibration detecting structure also comprises a gate electrode 21, a gate oxide film 23, a protection film 25 and an aluminum contact 27. In this vibration detecting structure, the gate electrode 21, the gate oxide film 23 and p+ type diffused layers 7 and 9 constitute a MOS transistor 33 as a whole.

The semiconductor vibration detecting structure thus constructed comprises three different functional portions; a first portion is a variable capacitor portion 29 formed between the elongated p+ type diffused layer 3 and the free end portion of the boron-doped polysilicon layer 17 coated with the nitride film layers of the cantilever 13 faced to the diffused layer 3, a second portion is a fixed capacitor portion 31 formed between the root of the cantilever 13, which is fixed on the oxide film 11 and the p+ type diffused layer 5 faced to the root of the cantilever 13 and a third portion is the MOS transistor portion 33 described above.

The cantilever 13 of the semiconductor vibration detecting structure according to the present invention vibrates in the direction substantially perpendicular to the surface of the silicon substrate 1. Namely, when the free end portion of the cantilever 13 is vibrated by any vibrations from outside, the distance between the silicon substrate 1 and the cantilever 13 varies, which causes the capacitance in the variable capacitor portion 29 to change in accordance with the change in the distance between the two. In this case, the cantilever 13 is vibrated most when a vibration having a vibration frequency equal to the resonance frequency of the cantilever 13 is applied thereto, which is determined by the length of the cantilever 13. As a result, the vibration having the resonance frequency can be detected with the highest sensitivity, by the semiconductor vibration detecting structure according to the present invention.

Figure 2:
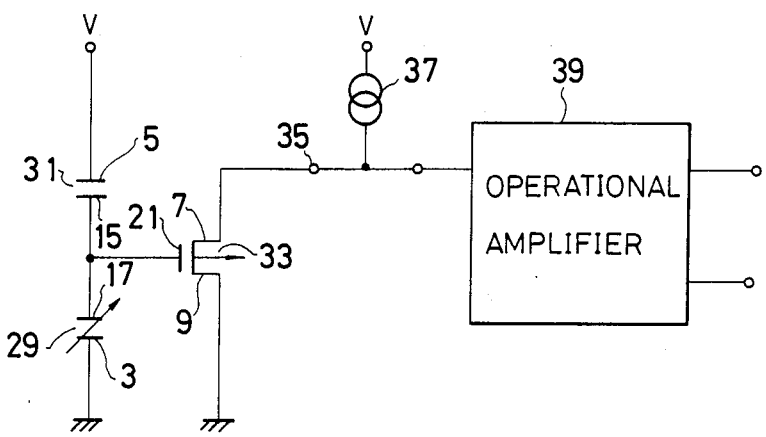
FIG. 2 is an equivalent electrical circuit of the semiconductor vibration detecting structure of FIG. 1.

FIG. 2 shows an electrically equivalent circuit of the semiconductor vibration detecting structure according to the present invention and its associated operational amplifier and a power supply.

In FIG. 2, the constructing elements of the equivalent circuit having the same reference numerals as those attached in FIG. 1 show the same elements in the figure.

The variable and fixed capacitors 29 and 31 are connected in series and one end of the variable capacitor 29 is connected to the ground and one end of the fixed capacitor 31 is connected to a power supply $V_d$ while the junction of the two capacitors is connected to the gate electrode 21 of the MOS transistor 33. The drain of the MOS transistor 33 is connected to the ground and the source thereof is connected both to a constant current source 37 and to an operational amplifier 39 through an output terminal 35. Although the constant current source 37 and the operational amplifier 39 are not shown in FIG. 1, they may integrally be formed on the same silicon substrate 1 in FIG. 1.

In the semiconductor vibration detecting structure thus constructed according to the present invention, to the junction point of the two capacitors 29 and 31 connected in series, i.e., the gate electrode 21 of the MOS transistor 33, there is applied a divided voltage of the power supply V. Accordingly, when a mechanical vibration is applied to the semiconductor vibration detecting structure from outside, the cantilever 13 is vibrated by the mechanical vibration. Since the capacitance of the variable capacitor 29 formed between the free end of the cantilever 13 and the substrate 1 is varied by the vibration, the divided voltage applied to the gate electrode 21 of the MOS transistor 33 is also varied in accordance with the change in the capacitance of the variable capacitor 29. As a result, the voltage thus varied is amplified through the MOS transistor 33 and is applied to the input of the operational amplifier 39 through the output terminal 35.

Consequently, the change in the output voltage from the MOS transistor 33 agrees with the vibration applied to the cantilever 13 from outside. In this case, when the vibration frequency applied to the cantilever 13 is equal to the resonance frequency of the cantilever 13, the cantilever vibrates most and this in turn causes the capacitance of the variable capacitor 29 to be changed most. As a result, the output voltage of the MOS transistor 33 is varied most, thus obtaining a large output voltage.

One the other hand, even if a vibration having a relatively large vibration level is applied to the cantilever 13 and the free end of the cantilever 13 is vibrated largely by it, the extreme end of the free end portion or the movable portion of the cantilever 13 never hits the surface of the oxide film 11 of the silicon substrate 1 as the free end of the cantilever 13 is curved in the direction deviating from the silicon substrate 1.

The curvature of the cantilever 13 can arbitrarily be changed by changing the thickness of the nitride film 19 for regulating the curvature.

Figure 3:
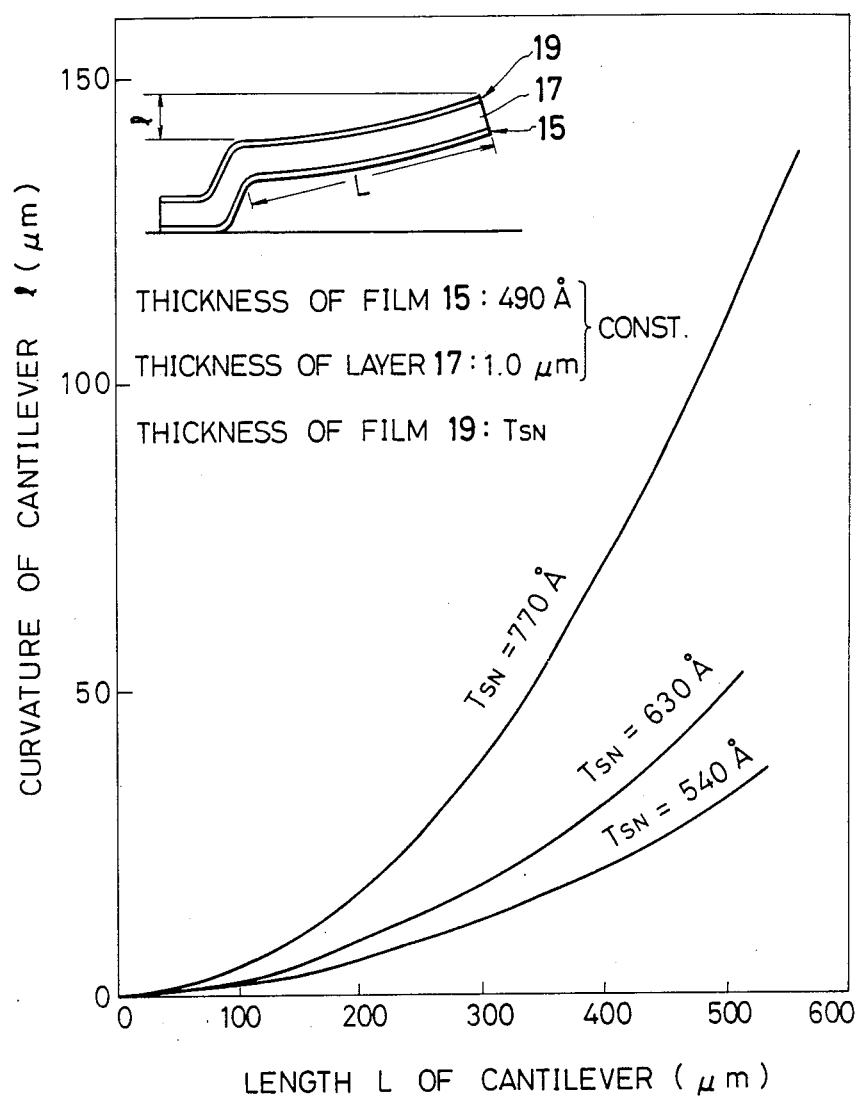
FIG. 3 shows characteristic curves of a relationship between the length and curvature of the cantilever to be formed on the semiconductor substrate of the semiconductor vibration detecting structure of FIG. 1.

FIG. 3 shows a graph of the relationship between the curvature of the cantilever and the length of the cantilever 13, with the thickness $T_{SN}$ of the nitride film 19 being a parameter for the regulating the curvature. The graph indicates that when the thickness of the lower nitride film 15 is 490 Å, and the thickness of the boron-doped polysilicon layer 17 of the cantilever 13 is 1.0 µm, the changes in the relationship between the length and the curvature of the cantilever 13 are shown, with the thickness of the nitride film 19 for regulating the curvature being variable, such as 540 Å, 630 Å and 770 Å. It is appreciated from FIG. 3 that the larger the thickness of the nitride film 19 becomes, the larger the curvature also becomes.

Namely, when the cantilever 13 is formed according to the known LPCVD method (Chemical Vapor Desposition method), an intrinsic stress remains in each film layer constituting the cantilever 13 and the nitride films 15 and 19 affect a tensile stress to the boron-doped polysilicon layer 17.

Moreover, another stresses are produced between the nitride film 15 and the boron-doped polysilicon layer 17, and between the polysilicon layer 17 and the nitride film 19 for regulating the curvature when the cantilever 13 is returned from the molding temperature to the ambient temperature due to the difference in thermal expansion index between the nitride films 15 and 19, and the boron-doped polysilicon layer 17. Consequently when the thickness of the nitride film 19 for regulating the curvature of the cantilever 19 is formed thicker than that of the nitride film 15, a tensile stress of the cantilever 13 in the upper direction, i.e., in the direction deviating apare from the silicon substrate 1 is formed in FIG. 1, with the result that the cantilever 13 curves in the upper direction in FIG. 1.

The curvature of the cantilever 13, when it is excessively made large, will result in a degration in the detection sensitivity, while when it is made too small, the extreme end of the cantilever 13 will often hit the silicon substrate 1. Accordingly, it is necessary for the curvature of the cantilever 13 to set up at a necessary minimum value or at optimum value.

As one example, assuming that the distance a at the root portion of the cantilever 13 is 1 µm with the length of 450 m and the resonance frequency is choson about 7 kHz, it is necessary to control the curvature of the cantilever 13 so that the distance d formed between the extreme end of the free end portion of the cantilever 13 and the oxide film 11 may be about 30 µm.

Figure 4:
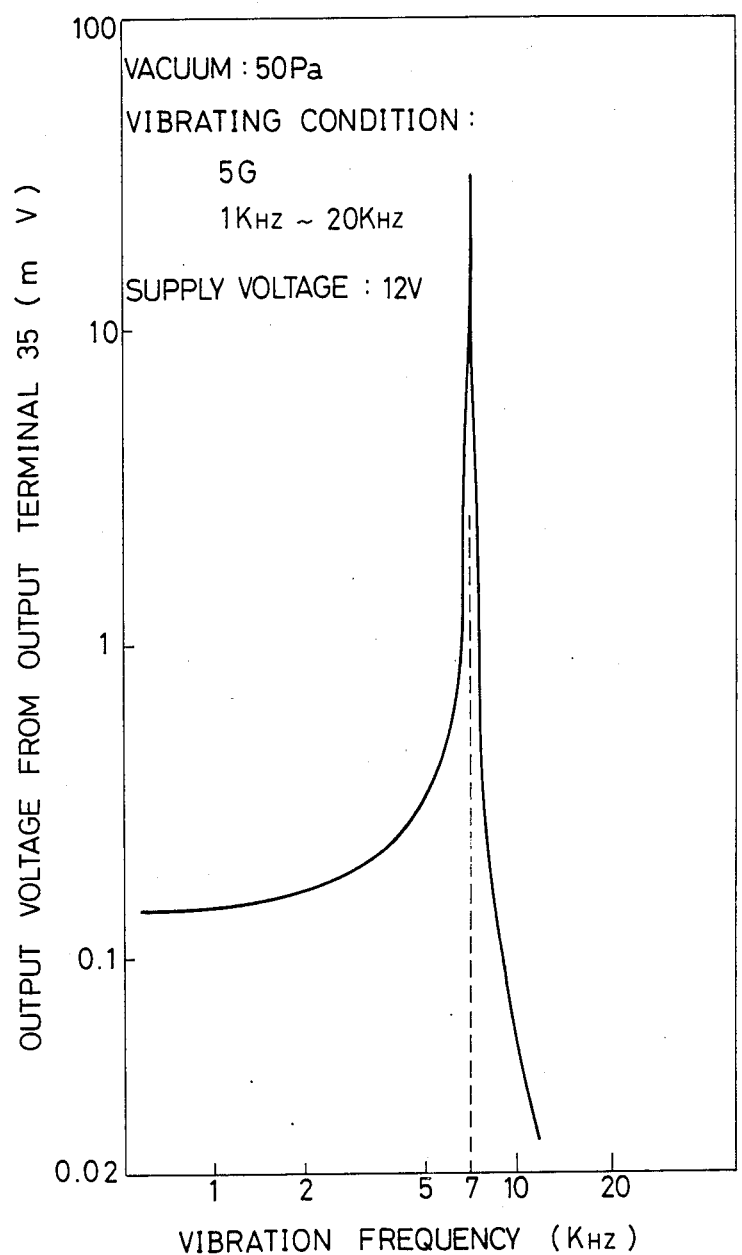
FIG. 4 shows the characteristic curve between vibration frequency applied to the semiconductor vibration detecting structure of FIG. 1 vs. output voltage therefrom.

FIG. 4 shows a graph showing the relationship between the vibration frequency applied to the semiconductor vibration detecting structure according to the present invention and the output voltage produced from the output terminal 35. The graph shows the characteristic of the case when, under the vacuum 50 Pa, vibrations having a frequency range between 1 kHz and 20 kHz and the acceleration of 5 G are applied to the detecting structure, with the power supply voltage V of the circuit being 12 Volts.

It is to be noted that when the vibration frequency is 7 kHz, the maximum output voltage can be obtained. Moreover, the output voltage of about 6 mV per 1 G is produced from the output terminal 35, thus enabling to detect a wide range of vibrations from less than 1 G to 40 G.

Moreover, the curvature of the cantilever 13 is determined by a combination of the nitride film 15, the boron-doped polysilicon layer 17 and the nitride film 19 for regulating the curvature. In practice, however, in order to form the cantilever, the lower nitride film 15 and the boron-doped polysilicon layer 17 are firstly formed and then the thickness of the film 15 must accurately be measured. After calculating the thickness of the upper nitride film 19 for regulating the curvature, the upper nitride film 19 is formed on the polysilicon layer 17.

In order to equalize or uniform the performance among the cantilevers of the semiconductor vibration detecting structures according to the present invention, it is necessary to control the curvature of the cantilever 13 with the accuracy of the order of approximately ±5 µm, subject to the length of the cantilever 13 being 450 µm. To this end, it is necessary to restrict the thickness of each nitride film 19 within the dispersions less than 2 to 3 percent.

For the purpose of forming the nitride film 19 for regulating the curvature of the cantilever 13, a method has been already proposed, wherein either the number of wafer sheets to be grown at one time is reduced in the process for forming the nitride film 19 for regulating the curvature, or the nitride films 19 having a smaller dispersion are formed by strictly controlling the growing conditions of the films.

However, it is preferable to utilize another etching method wherein the nitride film 19 for regulating the curvature of the cantilever is firstly formed at the thickness of about 50 A and after the thickness of the film is accurately measured, the etching of the film is carried out in heated phosphoric acid until it reaches a predetermined thickness under accurate control of the etching speed. This etching method has less error and the resultant thickness of the nitride film 19 for regulating the curvature can accurately be controlled at a predetermined value of the thickness.

Accordingly, the use of the etching method described above allows the fluctuation of the thickness in the wafers of the nitride films 19 to be small. As a result, even if any dispersions exist among lots of the semiconductor products, the nitride film 19 for regulating the curvature can be formed at low cost according to the LPCVD method in the subsequent process.

Moreover, in case the nitride films 15 and 19 impart a compression force to the boron-doped polysilicon layer 17 due to the differences in the manufacturing methods for forming the cantilever 13, the thickness of the nitride film 19 for regulating the curvature must be formed thinner than that of the nitride film 15.

As described in the foregoing, in the semiconductor vibration detecting structure according to the present invention, since the materials of the layers constituting the cantilever and thickness thereof are suitably selected and formed so as to have a curve in the direction deviating from the surface of the semiconductor substrate at the free end portion of the cantilever, the free end portion of the cantilever never hits the semiconductor substrate even if relatively large vibrations are applied thereto.

The semiconductor vibration detecting structure according to the present invention can particularly detect vibrations having a wide range of vibration frequencies and levels with a high sensitivity.

Moreover, since the curvature of the cantilever can arbitrarily be formed by selecting the materials of layers constituting the cantilever and the thickness of the layers, the cantilevers having a suitable curvature and having almost uniform vibration characteristics respectively, can be formed according to the method of present invention. This makes a large-scale mass production of the semiconductor vibration detecting structures possible, thus realizing the manufacturing of the semiconductor vibration structures at low cost.

While the invention has been described in its prefered embodiment, it is to be understood that the words which have been used are words of description rather than limitation and that various changes and modification may be made within the purview of the appended claims without departing from the true scope and spirit of the invention in its broader aspects.

What is claimed is:

1. A semiconductor vibration detecting structure having a semiconductor substrate (1) of a first conductivity type, a plurality of semiconductor layers (3, 5, 7, 9) of the second conductivity type opposite to that of the substrate diffused in the substrate, and a cantilever (13) comprising a root portion fixed to the substrate (1) through an insulator film and a movable beam (19) projecting from the root portion, the structure comprising:
   a fixed capacitor portion (31) formed between the root portion of said cantilever and said semiconductor substrate through the insulator film; and
   a variable capacitor portion (29) formed between the movable beam (19) of the cantilever and said semiconductor substrate, said cantilever gradually deflecting upward from the surface of said semiconductor layer towards the distal end of the cantilever.

2. The semiconductor vibration detecting structure as claimed in claim 1, wherein said cantilever comprising at least two layers having coefficients of thermal expansion different from each other.

3. The semiconductor vibration detecting structure as claimed in claim 2 wherein the semiconductor layer (17) of the cantilever is a boron-doped polysilicon layer and the other layer (15, 19) are nitride film layers coated on both surfaces of the polysilicon layer.

4. The semiconductor vibration detecting structure as claimed in claim 2 wherein the direction of the curvature of the free end portion of the cantilever is determined by the relationship among the thicknesses of the boron doped polysilicon layer and of the nitride film layers.

5. The semiconductor vibration detecting structure as claimed in claim 4 wherein the curvature (1) of the free end portion of the cantilever in the direction gradually deviating from the semiconductor substrate is determined by the thickness of the upper nitride film layer (19) for regulating the curvature of the cantilever, with the thicknesses of the boron-doped polysilicon layer (17), the lower nitride layer (15) and the length (L) of the cantilever being constant.

6. The semiconductor vibration detecting structure as claimed in claim 4, wherein the curvature (1) of the free end portion of the cantilever is formed in such that the cantilever (13) vibrates most, close to the upper surface of the semiconductor substrate coated with the oxide film but does not hit the upper surface of the oxide film, when vibration having a vibration frequency substantially equal to the resonance frequency of the cantilever is applied thereto.

7. The semiconductor vibration detecting structure as claimed in claim 5 wherein the curvature (1) of the free end portion of the cantilever (13) in the direction gradually deviating from the semiconductor layer increases according to a certain function, as the thickness of the upper nitride film layer for regulating the curvature is increased.

8. The semiconductor vibration detecting structure as claimed in any one of claim 2 wherein vibrations ranging from 1 G to 40 G can be detected, with the distance a between the lower surface of the cantilever at the root thereof and the upper surface of the oxide film being 1 $\mu$m, the distance b between the lower surface of the cantilever at the extreme end and the upper surface of the oxide film on the semiconductor substrate being 30 $\mu$m and the length L of the free end portion of the cantilever being 450 82 m.

9. The semiconductor vibration detecting structure as claimed in claim 8 wherein the resonance frequency of the cantilever is about 7 kHz where the maximum output voltage can be obtained from the output terminal of the MOS transistor portion of the detecting structure.

10. The semiconductor vibration detecting structure as claimed in claim 2 wherein at least one operational amplifier circuit is integrally formed on the same first time semiconductor substrate.

11. The semiconductor vibration detecting structure as claimed in claim 2 wherein said first type semiconductor substrate is made of N type semiconductor material and said second type semiconductor regions are made of P type semiconductor material.

12. The semiconductor vibration detecting structure as claim in claim 2, at least one of the layers of the cantilever is a deposited layer.

13. The semiconductor vibration detecting structure as claimed in claim 2, wherein, said cantilever is fabricated, under different temperature from that in use, as having a straight beam.

14. The semiconductor vibration detecting structure as claimed in claim 10 wherein said first type semiconductor substrate is made of N type semiconductor material and said second type semiconductor regions are made of P type semiconductor material.

* * * * *